(12) United States Patent
Takeuchi

(10) Patent No.: US 9,257,830 B2
(45) Date of Patent: Feb. 9, 2016

(54) SEMICONDUCTOR DEVICE

(71) Applicant: FUJI ELECTRIC CO., LTD., Kawasaki-shi (JP)

(72) Inventor: Toru Takeuchi, Azumino (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 587 days.

(21) Appl. No.: 13/674,302

(22) Filed: Nov. 12, 2012

(65) Prior Publication Data

US 2013/0155560 A1 Jun. 20, 2013

(30) Foreign Application Priority Data

Dec. 14, 2011 (JP) .................................. 2011-272874

(51) Int. Cl.
  *H02H 3/00* (2006.01)
  *H02H 3/20* (2006.01)
  *H01H 47/00* (2006.01)
  *H03K 17/082* (2006.01)
  *H03K 17/16* (2006.01)

(52) U.S. Cl.
  CPC ................. *H02H 3/20* (2013.01); *H01H 47/00* (2013.01); *H03K 17/0828* (2013.01); *H03K 17/166* (2013.01); *Y10T 307/826* (2015.04)

(58) Field of Classification Search
  USPC .......................................................... 361/89
  See application file for complete search history.

(56) References Cited

U.S. PATENT DOCUMENTS

| | | | |
|---|---|---|---|
| 4,809,122 A * | 2/1989 | Fitzner ............................ | 361/18 |
| 5,079,608 A * | 1/1992 | Wodarczyk et al. .......... | 257/355 |
| 5,608,595 A | 3/1997 | Gourab et al. | |
| 6,169,439 B1 * | 1/2001 | Teggatz et al. ................ | 327/309 |
| 6,181,083 B1 * | 1/2001 | Moisin .......................... | 315/291 |
| 6,687,106 B1 * | 2/2004 | Tanaka et al. ................. | 361/101 |
| 6,956,425 B2 * | 10/2005 | Adams .......................... | 327/309 |
| 2004/0252432 A1 * | 12/2004 | Sasaki et al. ................. | 361/91.1 |
| 2006/0018074 A1 * | 1/2006 | Inoue et al. ................... | 361/118 |
| 2006/0044025 A1 * | 3/2006 | Grbovic ........................ | 327/112 |
| 2012/0230076 A1 * | 9/2012 | Palmer et al. ................. | 363/132 |
| 2013/0155560 A1 * | 6/2013 | Takeuchi ........................ | 361/89 |
| 2013/0278298 A1 * | 10/2013 | Curbelo et al. ............... | 327/109 |
| 2014/0284662 A1 * | 9/2014 | Ikeda ............................ | 257/195 |

FOREIGN PATENT DOCUMENTS

JP  07-297358 A  11/1995
JP  2006-067795 A  3/2006

* cited by examiner

*Primary Examiner* — Ronald W Leja
(74) *Attorney, Agent, or Firm* — Rabin & Berdo, P.C.

(57) ABSTRACT

In a semiconductor device, a surge voltage is lowered on turning OFF of a switching element, and output current is reduced on turning ON of the switching element in a non-saturated condition to achieve a reduced amount of self-heating. The semiconductor device can comprise a semiconductor switching element, an overvoltage protection circuit, and a resistance circuit to transmit a control signal for turning the switching element ON and OFF to a control terminal of the switching element. The semiconductor device can further comprise a voltage detecting switch that receives a signal corresponding to a voltage appearing at the output terminal of the switching element on turning OFF of the switching element, and a gate resistor change-over switch that operates according to a voltage of a timing capacitor connected to the output side of the voltage detecting switch to increase a resistance value of the resistance circuit.

15 Claims, 4 Drawing Sheets

1 : SWITCHING ELEMENT (IGBT)
2 : FREE WHEELING DIODE (FWD)
3 : CONSTANT VOLTAGE DIODE
5 : DIODE
6 : GATE RESISTOR
7 : GATE RESISTOR
8 : GATE SIGNAL OUTPUT CIRCUIT
9 : CONSTANT VOLTAGE DIODE
2 2 : DIODE
2 3 : OVERVOLTAGE PROTECTION CIRCUIT

SEMICONDUCTOR DEVICE

CROSS-REFERENCE TO RELATED APPLICATION

This application is based on, and claims priority to, Japanese Patent Application No. 2011-272874, filed on Dec. 14, 2011, contents of which are incorporated herein by reference.

BACKGROUND OF THE INVENTION

1. Field of the Invention

The present invention relates to a semiconductor device providing an overvoltage protection function for a switching element.

2. Description of the Related Art

FIG. 4 shows a conventional example of a semiconductor device providing an overvoltage protection function for a switching element.

In FIG. 4, the reference numeral 1 designates a semiconductor switching element, for example, an insulated gate bipolar transistor (IGBT) and the reference numeral 2 designates a free-wheeling diode (FWD). Between the collector C and the gate G of the switching element 1 is connected an overvoltage protection circuit 23 composed of a series-connected circuit of a constant voltage diode 3 and a reverse-blocking diode 5 for a gate current. A constant voltage diode 9 is connected between the gate G and the emitter E of the switching element 1. The constant voltage diode 9 prevents the overvoltage noise due to a gate signal and the overvoltage protection circuit 23 from exceeding the withstand voltage of the gate G of the switching element 1.

The collector C is connected to the positive terminal of the DC power supply and the emitter E is connected to the negative terminal N of the DC power supply.

The reference numeral 8 designates a gate signal output circuit. Between the output terminal of the gate signal output circuit and the gate G of the switching element 1 connected is a series-connected circuit of a gate resistance 7 and a diode 22 for a gate bypass at an OFF time. A gate resistor 6 is connected in parallel with the series-connected circuit of the gate resistor 7 and the diode 22.

When switching drive is conducted on an inductive load (not shown in the figure) by applying a voltage between the collector and the emitter of the switching element 1 in this circuit, a surge voltage is generated due to the collector current variation di/dt at the time of turning OFF of the switching element 1 and the existence of a wiring inductance. If the maximum voltage, which is a voltage between the collector and the emitter superimposed with the surge voltage, exceeds a breakdown voltage between the collector and the emitter, the switching element 1 may breakdown due to overvoltage.

To cope with this issue, in the circuit of FIG. 4, when the voltage at the collector C of the switching element 1 rises to the voltage set by the constant voltage diode 3, a Zener current flows through the diode 3 and raises the gate voltage of the switching element 1 above the ON threshold value even though in the period of gate signal OFF (the period of the gate voltage lower than the ON threshold value). As a result, an electric current flows between the collector and the emitter of the switching element 1 to lower the collector voltage. Thus, the switching element 1 is protected from electric breakdown due to overvoltage.

Patent Document 1 (identified below) discloses an overvoltage protection circuit comprising a clamp circuit including a constant voltage diode between the collector and the gate of an IGBT. When an overvoltage is applied between the collector and the emitter, a Zener current flows through the clamp circuit to turn ON the IGBT in a non-saturated state. Thus, the voltage between the collector and the emitter decreases, performing overvoltage protection.

[Patent Document 1]

Japanese Unexamined Patent Application Publication No. H07-297358 (paragraphs [0065], [0066], and FIGS. 1 and 3, in particular)

When an overvoltage is applied between the collector and the emitter of a switching element 1 in the circuit of FIG. 4 or of the Patent Document 1, the switching element 1 is turned ON in a non-saturated state to decrease the voltage between the collector and the emitter. The energy of the surge voltage is self consumed and converted to heat. Although these conventional technologies can avoid electrical breakdown due to overvoltage, the self-heating abruptly increases at the turn OFF time presenting a problem of great burden on the switching element 1 and a gate control circuit for it.

SUMMARY OF THE INVENTION

It is therefore an object of the present invention to provide a semiconductor device in which the self-heating is suppressed by reducing current through the output terminal of the switching element owing to decreased current at the turning ON time of the semiconductor switching element in a non-saturated state in order to restrict a surge voltage at the turning OFF time of the semiconductor element.

To solve the problem, a semiconductor device of the present invention comprises an overvoltage protection circuit for protecting a semiconductor switching element such as an IGBT from overvoltage and a resistance circuit for transmitting a control signal to turn the switching element ON and OFF to a control terminal of the switching element. In addition to this basic construction, a semiconductor device of the invention further comprises characteristic components: a first switching means for receiving, through the overvoltage protection circuit, a signal corresponding to a voltage applied to the output terminal of the switching element at the turning OFF time thereof, and a second switching means operated with a voltage of a first capacitor connected to an output side of the first switching means for increasing a resistance value of the resistance circuit.

The first and the second switching means can each comprise a semiconductor switching element such as a MOSFET.

Preferably, a semiconductor device of the invention comprises a delaying means for transmitting information delivered from the overvoltage protection circuit to the first switching means with a delay. The delaying means comprises a second capacitor connected between the overvoltage protection circuit and the first switching means for delaying variation of input voltage to the first switching means.

Preferably, a semiconductor device of the invention comprises a timing control means for controlling a timing to operate the second switching means corresponding to the control signal. The timing control means includes the first capacitor that is charged or discharged corresponding to a level of the control signal and controls the timing to operate the second switching means corresponding to the voltage of the first capacitor.

Preferably, a semiconductor device of the invention increases the resistance value of the resistance circuit by operating so as to change a connection condition of a plurality of resistors.

In a semiconductor device of the invention, the gate resistance is changed to increase the gate resistance value for the switching element, for example, based on the collector voltage and the ON time at one cycle before, of the semiconductor switching element. As a result, the turning-OFF speed of the switching element is slowed down, decreasing the variation rate of the collector current. Thus, the surge voltage at the turning OFF is reduced.

Therefore, the voltage applied between the collector and the emitter of the switching element is reduced, which suppresses the self-heating of the switching element and mitigates the burden on the switching element and the gate control circuit.

DETAILED DESCRIPTION OF THE INVENTION

A preferred embodiment according to the present invention will be described in the following with reference to the accompanying drawings.

Figure 1:
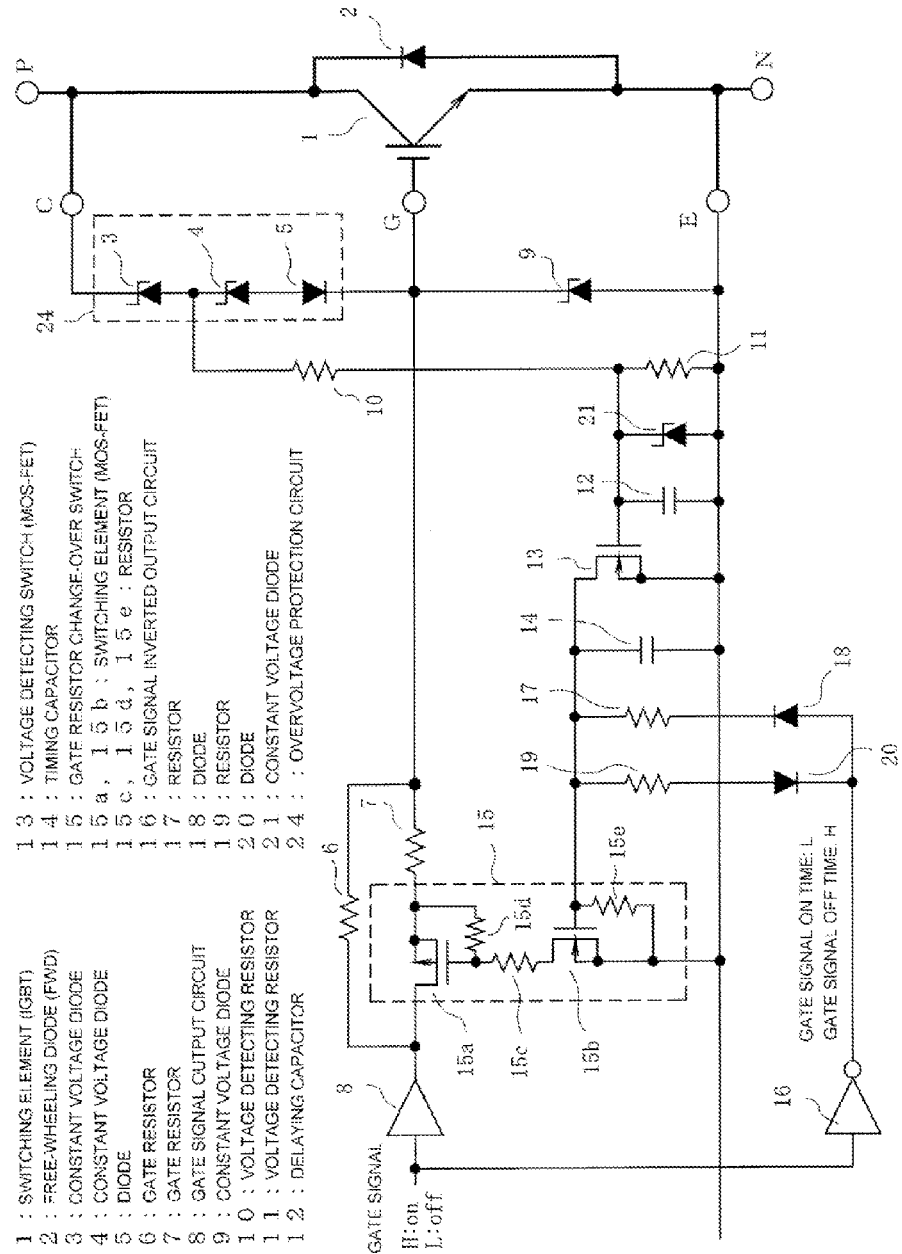
FIG. 1 is a circuit diagram of a semiconductor device of an embodiment according to the present invention.

Referring to FIG. 1, the reference numeral 1 designates a semiconductor switching element such as an IGBT; the symbol C designates a collector terminal connected to the positive terminal P of a DC power supply; G, the gate terminal of the switching element 1; E, an emitter terminal connected to the negative terminal N of the DC power supply; and the reference numeral 2 designates a free-wheeling diode.

The gate terminal G corresponds to, for example, a "control terminal," and the collector terminal C and the emitter terminal E correspond to, for example, "output terminals."

Between the connected collector terminal C and gate terminal G is a series-connected circuit of constant voltage diodes 3, 4 and a reverse blocking diode 5 for blocking a reverse gate current. A constant voltage diode 9 is connected between the gate terminal G and the emitter terminal E.

The constant voltage diodes 3 and 4 and the diode 5 form an overvoltage protection circuit 24 of a general self voltage clamp type. The operation voltage of the overvoltage protection circuit 24 is set by the series-connected circuit of the constant voltage diodes 3 and 4. The constant voltage of the constant voltage diode 3 is set at a value close to the normal operation voltage (e.g., collector voltage) of the switching element 1.

The constant voltage diode 9 prevents the overvoltage noise due to a gate signal and the overvoltage protection circuit 24 from exceeding the withstand voltage of the gate G of the switching element 1.

The reference numeral 8 designates a gate signal output circuit that outputs a gate signal given from the outside. A gate signal at a high level corresponds to ON of the switching element 1, and a gate signal at a low level corresponds to OFF of the switching element 1. The gate signal corresponds to a "control signal," for example.

A series-connected circuit of a gate resistor 7 and a switching element 15a in the gate resistor change-over switch 15 is connected in series between the output side of the gate signal output circuit 8 and the gate terminal G of the switching element 1. A gate resistor 6 is connected in parallel to the series circuit of the switching element 15a and the gate resistor 7.

The gate resistor 7 becomes effective when the electric potential of the timing capacitor 14, which will be described later, exceeds the input threshold level of the gate resistor change-over switch 15. The resistance value of the gate resistor 7 is set at 0 ohm, for example, or a much lower value than the resistance value of the gate resistor 6 in order to suppress switching loss during a normal operation period of the switching element 1.

The gate resistor change-over switch 15 comprises the switching element 15a and a switching element 15b connected between the gate of the switching element 15a and the emitter E of the switching element 1 through a resistor 15c. The switching elements 15a and 15b can be composed of MOS-FETs, for example. The resistors 15d and 15e are resistors connected between the gate and the emitter of the switching elements 15a and 15b, respectively. The gate resistor change-over switch 15 corresponds to, for example, "second switching means."

The semiconductor device of this embodiment comprises a series circuit of voltage detecting resistors 10 and 11 between the connection point of the constant voltage diodes 3 and 4 and the emitter E of the switching element 1. The connection point of the resistors 10 and 11 is connected to the gate of a voltage detecting switch 13 that includes a MOS-FET, for example. The voltage detecting switch 13 corresponds to, for example, "first switching means."

The reference numeral 12 designates a delaying capacitor for delaying the detecting timing of the gate signal of the voltage detecting switch 13 and the reference numeral 21 is a constant voltage diode for preventing an overvoltage from applying on the gate of the voltage detecting switch 13. The delaying capacitor 12 and the constant diode 21 are connected in parallel to the voltage detecting resistor 11.

The detecting resistors 10 and 11, and the delaying capacitor 12 correspond to, for example, "delaying means." The delaying capacitor 12 corresponds to, for example, a "second capacitor."

The collector of the voltage detecting switch 13 is connected to the gate of the switching element 15b and the voltage detecting switch 13 is connected to a timing capacitor 14 between the collector and the emitter of the voltage detecting switch 13. The timing capacitor 14 corresponds to, for example, a "first capacitor."

The gate signal is also given to a gate signal inverted output circuit 16. Between the output side of this gate signal inverted output circuit 16 and the gate terminal of the switching element 15b, and the collector terminal of the voltage detecting switch 13 as well, are connected a series circuit of a diode 18 and a resistor 17 and a series circuit of a diode 20 and a resistor 19 in parallel with each other.

The charging time of the timing capacitor 14 is determined by the resistance value of the resistor 17 and the discharging time of the timing capacitor 14 is determined by the resistance value of the resistor 19. The charging and discharging of the timing capacitor 14 is controlled by the output signal of the gate signal inverted output circuit 16 and the operation of the voltage detecting switch 13.

"Timing control means" can comprise, for example, the gate signal inverted output circuit 16, the diodes 18 and 20, the resistors 17 and 19, and the timing capacitor 14.

The gate resistor change-over switch 15 changes over ON and OFF states thereof according to the electric potential of the timing capacitor 14.

When the electric potential of the timing capacitor 14 exceeds the input threshold level of the gate resistor change-over switch 15, the switching elements 15b and 15a turn ON to make the gate resistor 7 effective and the parallel circuit of the gate resistors 6 and 7 is connected to the gate terminal of the switching element 1. When the electric potential of the timing capacitor 14 falls down below the input threshold level of the gate resistor change-over switch 15, the switching elements 15b and 15a turn OFF to make the gate resistor 7 ineffective and solely the gate resistor 6 is connected to the gate terminal G of the switching element 1.

Now, operation of the semiconductor device of this embodiment will be described in the following with reference to FIG. 2 as well as FIG. 1.

In the operation of the semiconductor device of this embodiment, the gate resistance value is increased at the turn OFF time of the switching element 1 to limit the gate current. As a consequence, the variation rate of the collector current di/dt through the switching element 1 is decreased and thus, the surge voltage is reduced. As a result, the voltage applied between the collector and the emitter of the switching element 1 is preliminarily limited below the breakdown voltage. Therefore, such a protection operation is avoided to the utmost that the overvoltage protection circuit 24 turns the switching element 1 ON in an unsaturated condition, to suppress self-heating in the switching element 1.

Surge voltage exceeding the breakdown voltage of the switching element 1 tends to be generated when the voltage between the collector and the emitter (the collector-emitter voltage) is high and the collector current is large. A large current variation rate di/dt at the turning OFF of the switching element 1 generates a large surge voltage.

This current variation rate di/dt can be controlled by the gate resistance value (consequently by the gate current) at the turn OFF time. Therefore, the surge voltage at a turn OFF time of the switching element 1 can be limited by controlling the gate resistance value based on the collector-emitter voltage and the collector current of the switching element 1.

The information about the collector-emitter voltage of the switching element 1 is obtained in the OFF period of the stitching element 1. Immediately before turning OFF of the switching element 1, the switching element 1 is in an ON state and so, the information about the collector-emitter voltage cannot be acquired. Consequently, the collector-emitter voltage is detected in the OFF period of one cycle before, for example, and used for controlling the gate resistance value at the turn OFF time afterward.

Considering this situation, in the embodiment of FIG. 1, a signal corresponding to the collector-emitter voltage in the OFF period of one cycle before is assumed to be equivalent to the slowly varying voltage that is regulated by the constant voltage diode, divided by the voltage detecting resistors 10 and 11, and delayed by the delaying capacitor 12. The voltage detecting switch 13 is operated by this signal. Thus, when the collector voltage of the switching element 1 exceeds the set voltage of the constant voltage diode 3, the voltage detecting switch 13 turns ON after the time that is adjusted by the resistance values of the voltage detecting resistors 10 and 11 and the capacitance value of the delaying capacitor 12.

Figure 2:
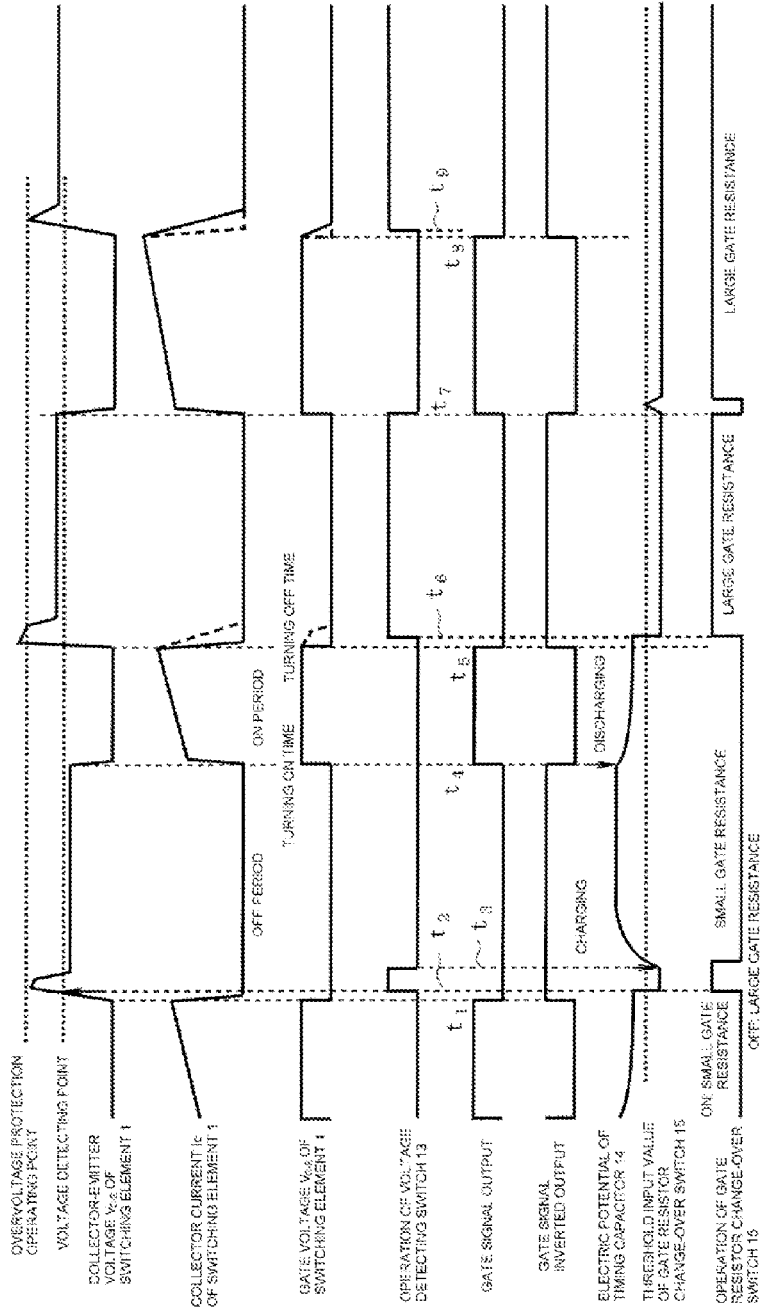
FIG. 2 is a timing chart showing operation of a semiconductor device of the embodiment according to the present invention.

Referring to FIG. 2, the gate signal turns to a "Low" level at the time t1, and then the collector voltage of the switching element 1 reaches the set voltage of the constant voltage diode 3. After that, the voltage detecting switch 13 turns ON at the time t2 after passing the time that is determined by the resistances of the voltage detecting resistors 10 and 11 and the capacitance of the delaying capacitor 12. The collector-emitter voltage of the switching element 1 at this moment is the "voltage detecting point" indicated in FIG. 2.

When the voltage detecting switch 13 turns ON, the timing capacitor 14 immediately discharges. When the electric potential of the timing capacitor 14 decreases below the threshold value for the switching element 15b of the gate resistance change-over switch 15 to turn ON, which is the threshold input value of the gate resistor change-over switch 15, the switching elements 15b and 15a turn OFF. Because turning ON of the switching element 15a results in turning ON of the switching element 15b, and turning OFF of the switching element 15a results in turning OFF of the switching element 15b, the turning ON or OFF of the switching elements 15b and 15a is equivalent to turning ON or OFF of the gate resistor change-over switch 15.

After the switching elements 15b and 15a are turned OFF, or after the gate resistor change-over switch 15 is turned OFF, solely the gate resistor 6 remains connected between the gate signal output circuit 8 and the gate terminal G of the switching element 1, and the gate resistor 7 is removed.

In this condition, the turning OFF speed of the switching element 1 is determined solely by the gate resistor 6, and the gate resistance value is larger than the one in the condition with the resistors 6 and 7 connected in parallel. The current variation rate di/dt consequently decreases. Therefore, the surge voltage superimposed on the collector-emitter voltage of the switching element 1 is reduced.

When the collector-emitter voltage of the switching element 1 decreases below the voltage detecting point, the voltage detecting switch 13 turns OFF at the time t3.

After the time t1, the output of the gate signal inverted output circuit 16 is at a "High" level. After the voltage detecting switch 13 turns OFF at the time t3, the timing capacitor 14 is charged, through the diode 18 and the resistor 17, to the output voltage level of the gate signal inverted output circuit 16. The resistance value of the resistor 17, which determines the time constant of the charging process, is so determined that the charging time for the timing capacitor 14 is longer than the time for developing the surge voltage.

When the electric potential of the timing capacitor 14 exceeds the threshold input value of the gate resistor change-over switch 15, the gate resistor change-over switch 15 turns ON and the parallel circuit of the gate resistors 6 and 7 is connected to the gate terminal G of the switching element 1, reducing the gate resistance value.

When the gate signal changes to a "High" level at the time t4, the gate voltage immediately rises to turn the switching element 1 ON. Since the output of the gate signal inverted output circuit 16 is at a "Low" level after the time t4, the timing capacitor 14 discharges through the resistance 19 and the diode 20, gradually decreasing the voltage across the timing capacitor 14. The time constant for this discharging process can be set at a desired value by selecting an appropriate resistance value of the resistor 19.

After the gate signal changes to a "Low" level at the time t5, at the time t6 just a short time later, the voltage detecting switch 13 turns ON and the gate resistor change-over switch 15 turns OFF similarly to the process at the time t2. As a result, solely the gate resistor 6 is connected to the gate terminal G of the switching element 1, which increases the gate resistance value and reduces the current varying rate di/dt.

The behavior of the collector current and the gate voltage of the switching element 1 in the time period from t5 to t6 is the same as the one in the time period from t1 to t2 as is apparent from FIG. 2.

In the turn OFF time of the switching element 1, the emitter-collector voltage exceeds the operating point of overvoltage protection as shown in FIG. 2. Thus, the overvoltage protection circuit 24 works to turn the switching element 1 ON in a non-saturated condition and decreases the collector-emitter voltage. However, the current variation rate di/dt is small in this case and the surge voltage is restricted. Therefore, relatively small voltage develops between the collector and the emitter and a small amount of energy is self-consumed in the switching element 1 in the ON state.

After the collector-emitter voltage decreases below the overvoltage protection operation point and until the gate signal changes to a "High" level at the time t7, the voltage detecting switch 13 is in the ON state and the gate resistor change-over switch 15 is in the OFF state. Thus, solely the gate resistor 6 is connected to the gate terminal G of the switching element 1, holding the state of large gate resistance value.

In the period from the time t5 to t7, although the gate signal is at a "Low" level and the gate signal inverted output is at a "High" level, the voltage detecting switch 13 is in an ON state as mentioned above. As a result, the timing capacitor 14 is not charged and the electric potential thereof remains below the threshold input value of the gate resistor change-over switch 15.

When the gate signal, which has been at a "High" level in the period from the time t7 to t8, changes to a "Low" level at the time t8, the switching element 1 turns OFF. At this time, the gate resistance value is held at the large value and the current variation rate di/dt of the collector current is small, so the collector current decreases slowly after the time t8 and the surge voltage is reduced at the turn OFF time. The voltage detecting switch 13 turns ON at the time t9 at which the collector-emitter voltage of the switching element 1 exceeds the voltage detecting point.

Figure 3:
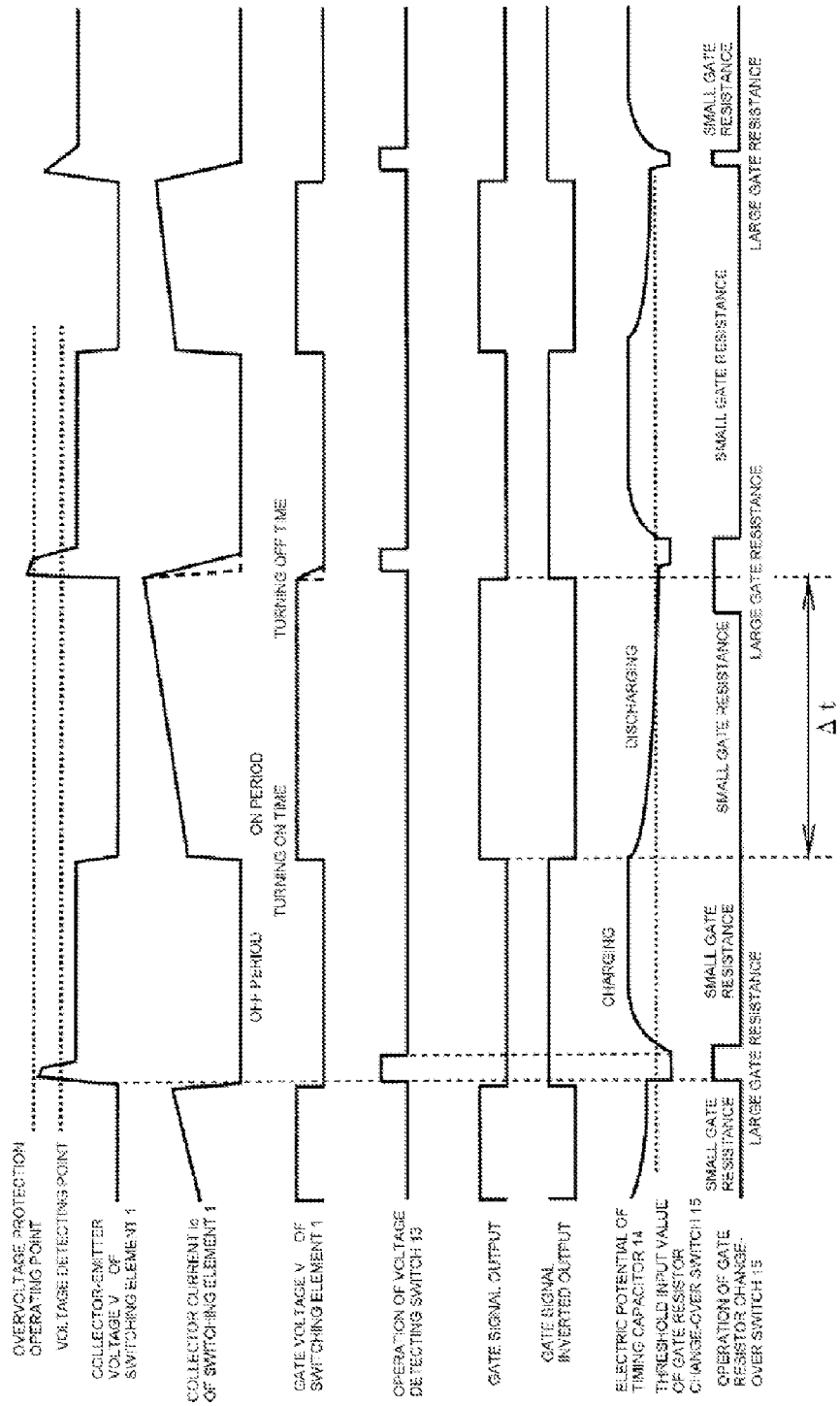
FIG. 3 is a timing chart showing operation, in the case of a long ON time period of the switching element, of a semiconductor device of the embodiment according to the present invention.
Figure 4:
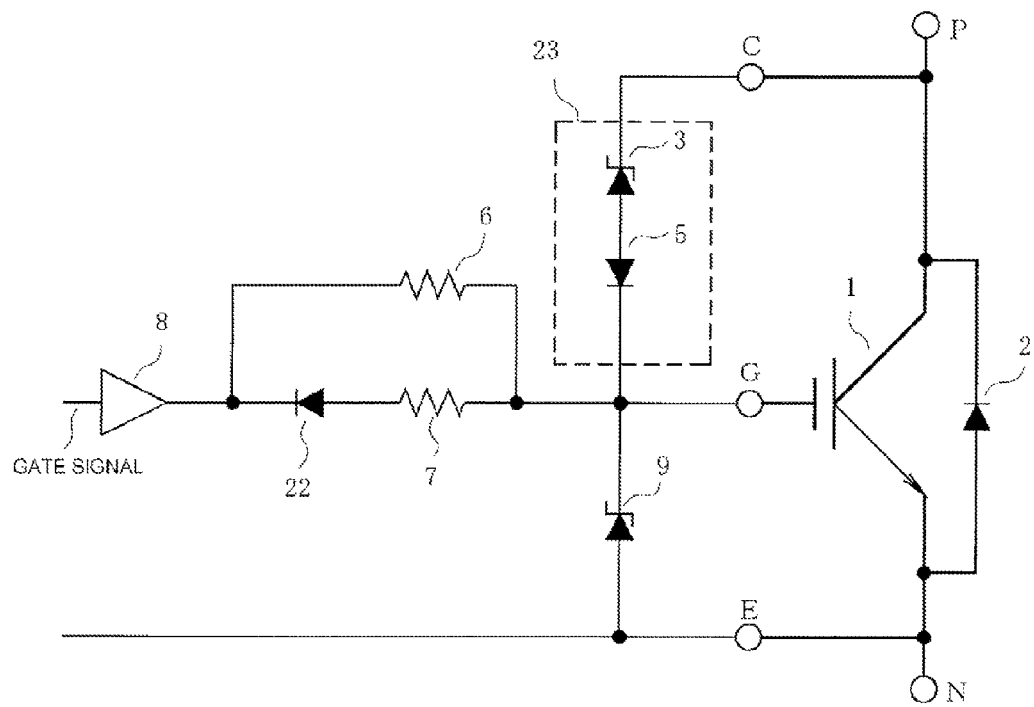
FIG. 4 is a circuit diagram of a semiconductor device of a conventional technology.

FIG. 3 shows the timing chart in the case in which the gate signal is held at a "High" level for a long period of time, such as the period Δt indicated in FIG. 3 causing a long ON time of the switching element 1 over the permitted period of time and resulting in an overcurrent state of the switching element 1, which is a state a current-time product exceeds the permitted value.

As described previously, the timing capacitor 14 is discharged, using the output of the gate signal inverted output circuit 16, through the diode 20 and the resistor 19 in this embodiment. The discharging time constant determined by the resistor 19 is set to an ON time that corresponds to the overcurrent state for the switching element 1.

Consequently, in the case of a long ON period, the timing capacitor 14 is discharged before the collector current of the switching element 1 becomes an overcurrent state. When the electric potential of the timing capacitor 14 decreases below the threshold input value of the gate resistor change-over switch 15, the gate resistor change-over switch 15 turns OFF with a speed lower than a normal speed because the turn OFF speed is determined by the gate resistance value.

Therefore, the current variation rate di/dt in the switching element 1 is lowered and the surge voltage is reduced also in this case of long ON period of switching element 1.

The present invention can be applied to power modules and other various types of semiconductor apparatuses that use a semiconductor switching element such as an IGBT.

While the present invention has been particularly shown and described with reference to certain specific embodiments, it will be understood by those skilled in the art that the foregoing and other changes in form and details can be made therein without departing from the spirit and scope of the present invention.

What is claimed is:

1. A semiconductor device comprising:
   a semiconductor switching element;
   an overvoltage protection circuit to protect the switching element from overvoltage;
   a resistance circuit to transmit a control signal for turning the switching element ON and OFF to a control terminal of the switching element;
   a first switching means for receiving, through the overvoltage protection circuit, a signal corresponding to a voltage appearing at an output terminal of the switching element on turning OFF of the switching element;
   a second switching means for operating according to a voltage of a first capacitor connected to an output side of the first switching means to increase a resistance value of the resistance circuit; and
   a timing control means for controlling timing of operating the second switching means in accordance with the voltage of the first capacitor, the first capacitor being charged or discharged responsive to a level of the control signal,
   wherein the timing control means turns off the second switching means by discharging the first capacitor with the control signal before the elapse of an ON time of the control signal causes an excessive current to flow in the switching element, and slows a turn-off speed of the switching element by increasing the resistance value.

2. The semiconductor device according to claim 1, further comprising a delaying means for delaying information given by the overvoltage protection circuit and transmitting the information to the first switching means.

3. The semiconductor device according to claim 2, wherein the delaying means comprises a second capacitor that is connected between the overvoltage protection circuit and the first switching means and delays variation of input voltage to the first switching means.

4. The semiconductor device according to claim 2, wherein the second switching means operates to change a connecting condition of a plurality of resistors and to increase the resistance value of the resistance circuit.

5. The semiconductor device according to claim 2, wherein the second switching means operates to change a connecting condition of a plurality of resistors and to increase the resistance value of the resistance circuit.

6. The semiconductor device according to claim 2, wherein the second switching means comprises at least one semiconductor switching element that operates corresponding to a voltage across the first capacitor.

7. The semiconductor device according to claim 2, wherein the second switching means comprises at least one semiconductor switching element that operates corresponding to a voltage across the first capacitor.

8. The semiconductor device according to claim 1, wherein the second switching means operates to change a connecting condition of a plurality of resistors and to increase the resistance value of the resistance circuit.

9. The semiconductor device according to claim 1, wherein the first switching means comprises a semiconductor switching element that operates corresponding to a divided voltage value of a voltage dividing resistor connected to the overvoltage protection circuit.

10. The semiconductor device according to claim 1, wherein the second switching means comprises at least one semiconductor switching element that operates corresponding to a voltage across the first capacitor.

11. An apparatus, comprising:
a switching element;
a resistance device coupled to the switching element; and
a control device configured to increase a resistance value of the resistance device based on a switching state of the switching element;
wherein the control device includes:
a first switching device coupled to a change signal, the change signal being transmitted in response to a change in the switching state of the switching element;
a second switching device coupled to the first switching device, and configured to, in response to information transmitted from the first switching device, change in switching state to cause the resistance value to increase; and
a timing device directly connected to a node common to the first switching device and the second switching device, and configured to at least partly determine a timing of switching of the second switching device.

12. The apparatus of claim 11, further comprising a delay device configured to delay the information transmitted from the first switching device.

13. The apparatus of claim 12, wherein the delay device is configured to delay a signal corresponding to a voltage at a terminal of the switching element, to control a change in state of the first switching device.

14. The apparatus of claim 13, wherein the resistance device comprises a first resistor and a second resistor, coupled in parallel between the switching element and a control signal that controls the switching state of the switching element.

15. The apparatus of claim 14, wherein the second switching device is coupled to the second resistor, and configured to, in response to the information transmitted from the first switching device, change in state to decouple the second resistor from the first resistor.

* * * * *